United States Patent
Mihnea et al.

(10) Patent No.: US 8,139,421 B2
(45) Date of Patent: *Mar. 20, 2012

(54) ERASE DEGRADATION REDUCTION IN NON-VOLATILE MEMORY

(75) Inventors: Andrei Mihnea, Boise, ID (US); William Kueber, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/906,497

(22) Filed: Oct. 18, 2010

(65) Prior Publication Data
US 2011/0032768 A1 Feb. 10, 2011

Related U.S. Application Data

(63) Continuation of application No. 12/058,839, filed on Mar. 31, 2008, now Pat. No. 7,817,478.

(51) Int. Cl.
*G11C 11/34* (2006.01)
(52) U.S. Cl. ......... 365/185.29; 365/185.18; 365/185.19; 365/185.22

(58) Field of Classification Search ............. 365/185.29, 365/185.22, 185.18, 185.19
See application file for complete search history.

(56) References Cited

U.S. PATENT DOCUMENTS

| | | | | |
|---|---|---|---|---|
| 6,266,278 | B1 * | 7/2001 | Harari et al. | 365/185.18 |
| 7,196,932 | B2 | 3/2007 | Takeuchi et al. | |
| 7,327,604 | B2 | 2/2008 | Miwa et al. | |
| 7,349,257 | B2 | 3/2008 | Lee et al. | |
| 7,817,478 | B2 * | 10/2010 | Mihnea et al. | 365/185.29 |

* cited by examiner

*Primary Examiner* — Son Dinh
(74) *Attorney, Agent, or Firm* — Leffert Jay & Polglaze, P.A.

(57) ABSTRACT

Methods for erasing a memory device and memory systems are provided, such as those including a non-volatile memory device is erased by using an intermediate erase step prior to a normal erase step. The intermediate erase step is comprised of an erase pulse voltage, applied to the semiconductor well of the selected memory block of memory cells, while edge rows of memory cells are biased at a low positive voltage (e.g., 0.2-2V). An erase verify operation is then performed. If the selected memory block is not erased, a normal memory erase step is then performed in which the same erase pulse voltage is used but all of the rows are biased at ground potential as in a normal erase step. If the memory block is still fails the erase verify operation, the erase pulse voltage is increased and the process repeated.

19 Claims, 6 Drawing Sheets

US 8,139,421 B2

ERASE DEGRADATION REDUCTION IN NON-VOLATILE MEMORY

RELATED APPLICATION

This Application is a Continuation of U.S. application Ser. No. 12/058,839, titled "ERASE DEGRADATION REDUCTION IN NON-VOLATILE MEMORY," filed Mar. 31, 2008, now U.S. Pat. No. 7,817,478 (Allowed) which is commonly assigned and incorporated herein by reference.

TECHNICAL FIELD

The present invention relates generally to memory devices and, in a particular embodiment, the present invention relates to non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Flash memory cells should be erased prior to being programmed. A typical erase operation comprises grounding all of the word lines of the selected memory block to be erased. A positive erase pulse is then applied to the well of the selected memory block. The erase pulse is incremented until the selected memory block passes the erase verify operation.

For NAND flash memory, as the erase voltage increases, the cells on the edge rows of the memory block tend to degrade due to electron tunneling and trapping near the active diffusion region between the last gate stack in the selected memory block and the select gate. Over multiple erase cycles, this degradation can get worse, making it difficult for the edge cells to erase properly.

For the reasons stated above, and for other reasons stated below that will become apparent to those skilled in the art upon reading and understanding the present specification, there is a need in the art for a way to erase non-volatile memory cells while reducing erase degradation.

DETAILED DESCRIPTION

Figure 1:
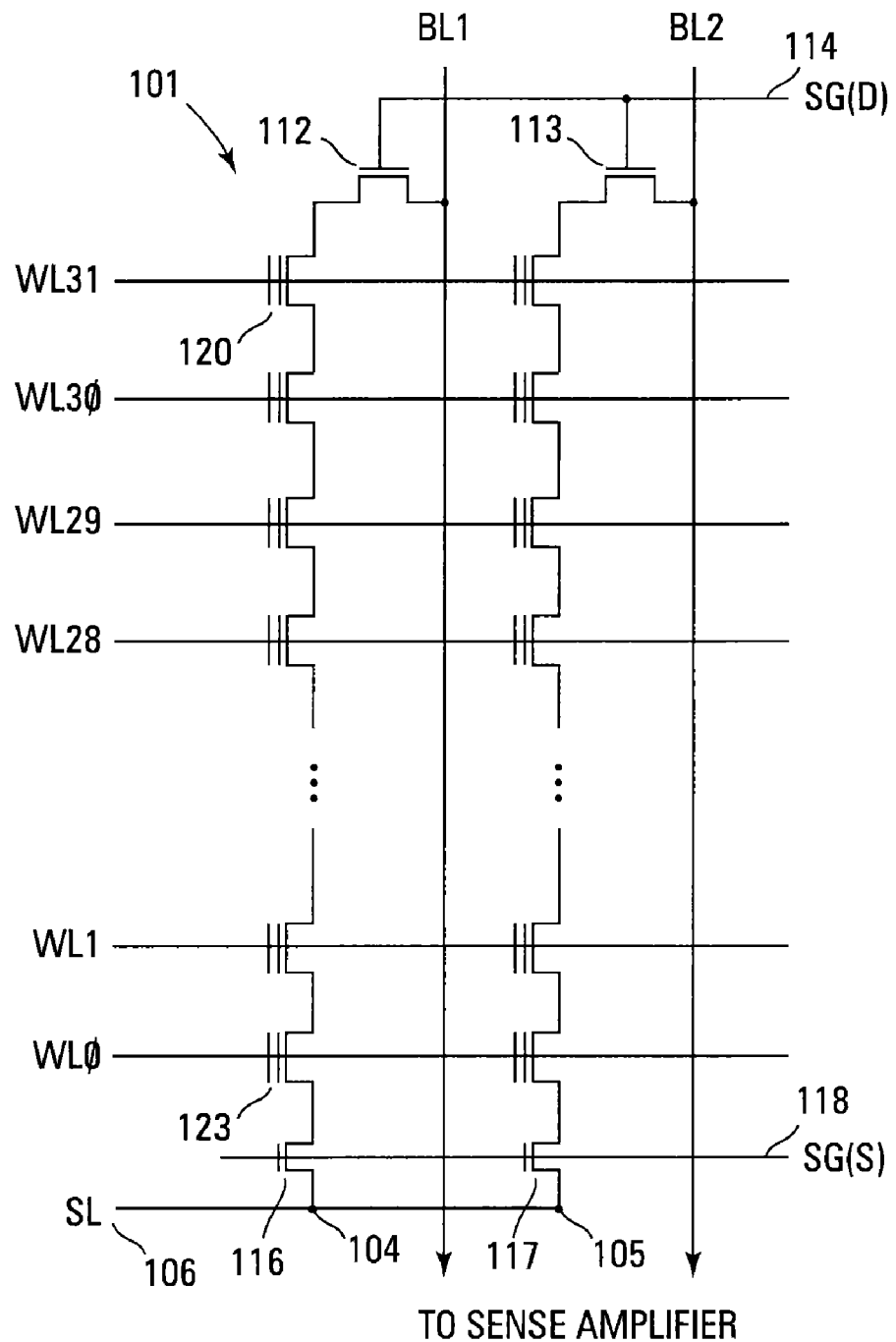
FIG. 1 shows a simplified diagram of one embodiment of a portion of a NAND flash memory array.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a schematic diagram of a portion of a NAND architecture memory array comprising series strings of non-volatile memory cells. The memory array is comprised of an array of non-volatile memory cells 101 (e.g., floating gate) arranged in series strings 104, 105 (e.g., columns). Each of the cells 101 is coupled drain to source with preceding and subsequent cells in each series string 104, 105. Each series string 104, 105 is coupled to a different bit line BL1, BL2. The bit lines BL1, BL2 are eventually coupled to sense amplifiers (not shown) that detect the state of each cell by sensing current on a particular bit line.

Each series string 104, 105 of memory cells is coupled to a source line 106 by a source select gate 116, 117 and to an individual bit line BL1, BL2 by a drain select gate 112, 113. The source select gates 116, 117 are controlled by a source select gate control line SG(S) 118 coupled to their control gates. The drain select gates 112, 113 are controlled by a drain select gate control line SG(D) 114.

A word line WL0-WL31 that spans across multiple series strings 104, 105 is connected to the control gates of each memory cell in a row in order to control their operation in response to biasing of the bit lines. Word lines of unselected memory cells in each series string 104, 105 are biased such that the coupled memory cells operate in a pass through mode.

Each memory cell can be programmed as a single level cell (SLC) or multilevel cell (MLC). Each cell's threshold voltage ($V_t$) is indicative of the data that is stored in the cell. For example, in an SLC device, a $V_t$ of 0.5V might indicate a programmed cell (i.e., logical 0 state) while a $V_t$ of −0.5V might indicate an erased cell (i.e., logical 1 state). The MLC device has multiple $V_t$ ranges that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

For example, a cell may be assigned four different voltage ranges of 200 mV for each range. Typically, a dead space or margin of 0.2V to 0.4V is between each range. If the voltage stored on the cell is within the first range, the cell is storing a 11 and is considered erased. If the voltage is within the second range, the cell is storing a 01. This continues for as many ranges that are used for the cell. In one embodiment, 11 is the most negative threshold voltage range while 10 is the most positive threshold voltage range. Alternate embodiments can assign the logical states to different threshold voltage ranges.

The embodiments of the present disclosure are not limited to two bits per cell. Some embodiments may be programmed to more than two bits per cell, depending, for example, on the quantity of different voltage ranges that can be differentiated on the cell.

During a typical programming operation, the selected word line for the flash memory cell to be programmed is biased with a series of programming pulses that start at a voltage that, in one embodiment, is greater than 16V with each subsequent pulse voltage increasing incrementally until the cell is programmed or a maximum programming voltage is reached. Each programming pulse moves the cell $V_t$ closer to its target voltage.

A program verification operation with a word line voltage of approximately equal with the target threshold voltage is performed between each programming pulse to determine if the floating gate has reached the target threshold voltage. The unselected word lines for the remaining cells are typically biased at approximately 10V during the program operation. Each of the memory cells is programmed in a substantially similar fashion.

Figure 2:
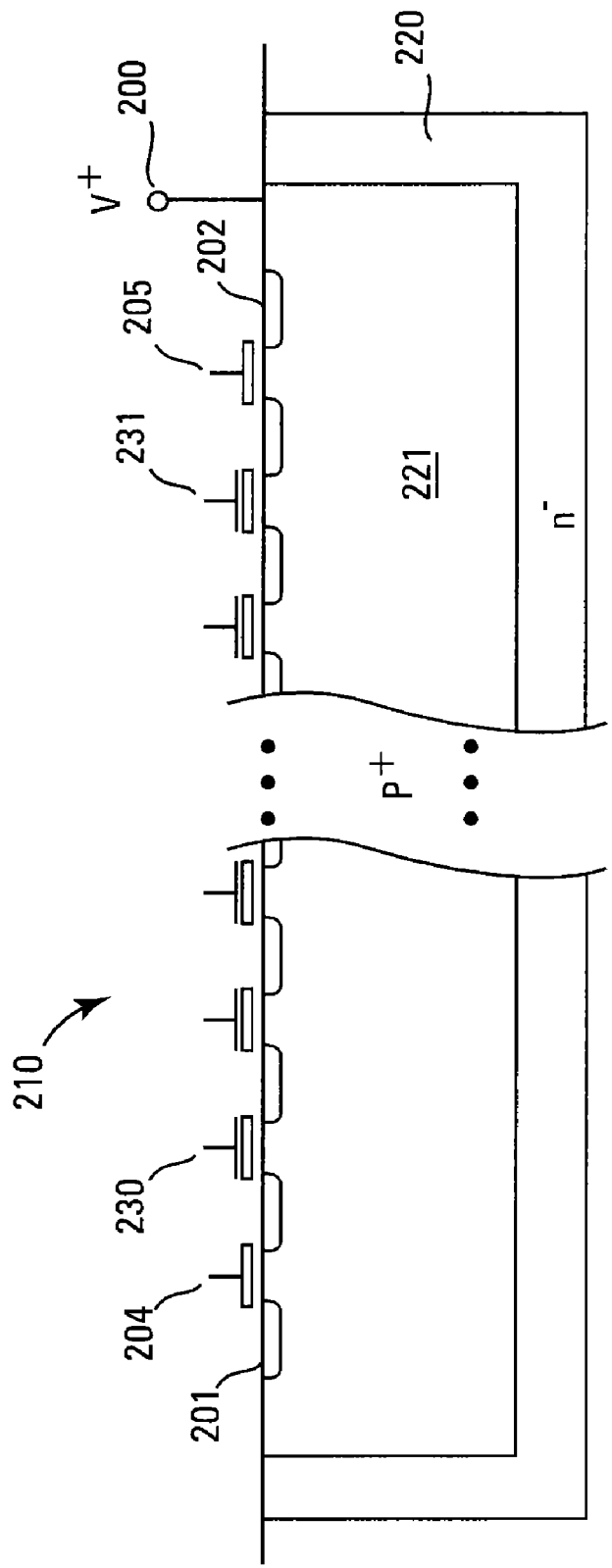
FIG. 2 shows a cross sectional view of one embodiment of a substrate p-well that contains a block of memory cells to be erased in accordance with the method of FIG. 3.

FIG. 2 illustrates a cross sectional view of one embodiment of a p-well in a substrate. The illustrated well, also referred to as a tub, is comprised of a p-type material 221 (e.g., silicon) that is surrounded by an n-type material 220. The n-type material 220 isolates the well from the remainder of the substrate elements.

The block of memory cells is comprised of a plurality of series strings of memory cells 210, as illustrated in FIG. 1, formed between a source line 201 and a drain line 202. Access to the source line 201 is controlled by the select gate source transistor 204. Access to the drain line 202 and thus the bit line is controlled by the select gate drain transistor 205.

FIG. 2 also illustrates the "edge" cells 230, 231 that can be affected by a normal memory erase operation. These cells are part of the word lines that are adjacent to the select gate drain transistor 205 and the select gate source transistor 204, respectively. In other words, the edge cells 230, 231 only have one adjacent memory cell in their respective string.

The conductivity types (i.e., p+, n−) illustrated in FIG. 2 are for purposes of illustration only. In an alternate embodiment, the well can be an n-type material that is isolated from the rest of the substrate by p-type implants.

Figure 3:
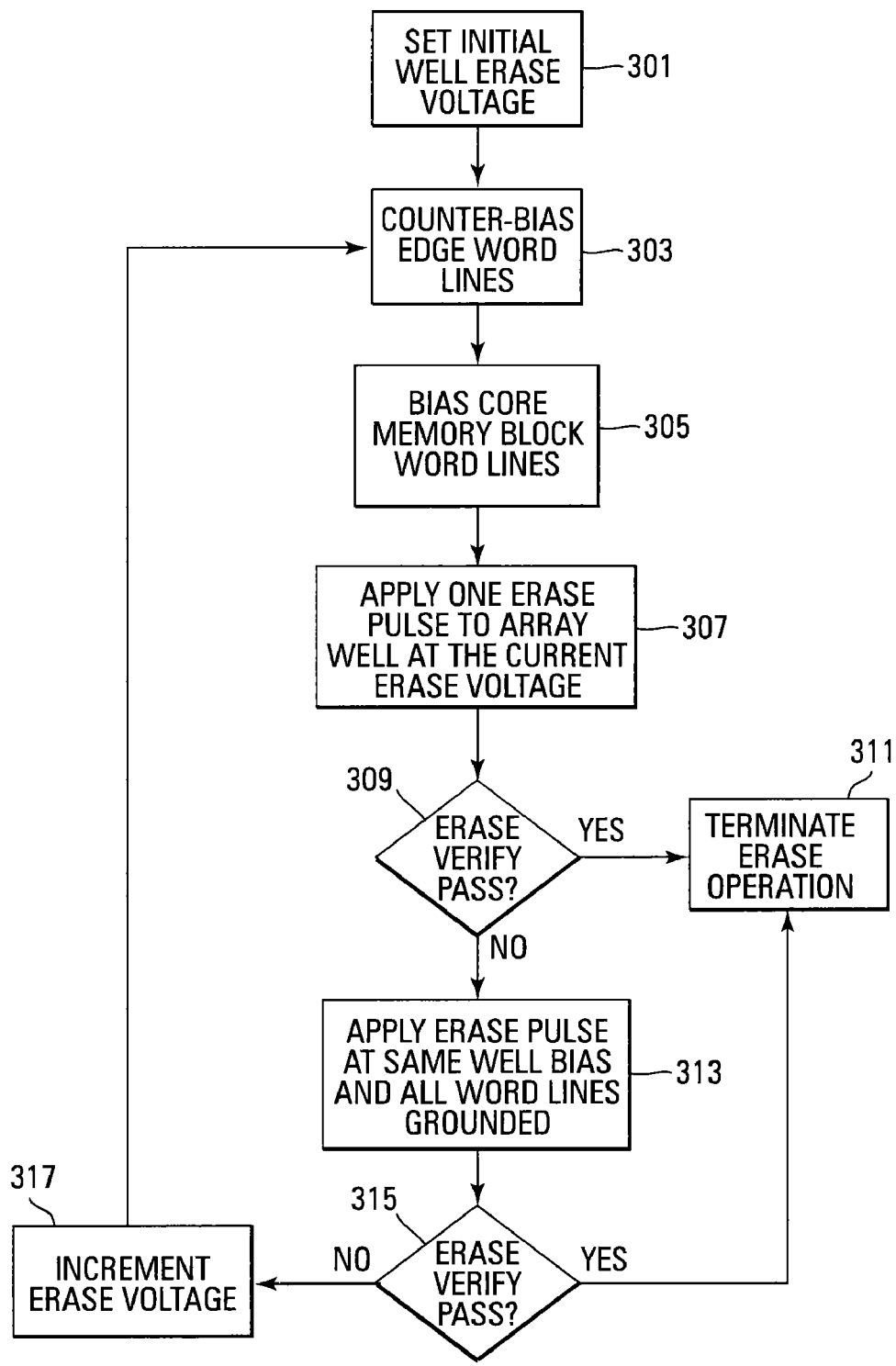
FIG. 3 shows a flow chart of one embodiment of a method for erasing a selected block of memory cells.

FIG. 3 illustrates a flow chart of one embodiment of a method for erasing a block of memory cells. The initial erase voltage is set 301 for the well of the memory block selected to be erased. In one embodiment, this initial voltage is +15V. Alternate embodiments can use other voltages such as a voltage in the range of 15-26V.

The edge word lines are counter-biased 303 with a small positive voltage. For example, one embodiment can use a counter-bias voltage in a range of 0.2-2V. Alternate embodiments might use other voltages and/or voltage ranges. The remaining word lines of the selected memory block are biased at ground potential 305.

After the edge word lines of the selected memory block are counter-biased and the remaining word lines of the selected memory block are biased at ground, an erase pulse at an initial voltage (e.g., +15V) is applied to the memory block well 307. An erase verify operation is then performed to determine if the selected memory block has been erased 309.

The purpose of the erase verify operation is to determine that the cell's $V_t$ is below a maximum voltage level (e.g., −1V). The most straightforward method for performing an erase verify is to apply an erase verify voltage as $V_{wl}$ to the memory cell control gate (e.g., a word line). If the $V_t$ is less than or equal to $V_{wl}$, the cell conducts. If $V_t$ is greater than $V_{wl}$, the cell does not conduct.

The current causes the bit line voltage to decay and a sense amplifier detects the voltage decay. The rate of voltage decay detected by the sense amplifier determines whether or not the cell's $V_t$ is above or below the erase maximum threshold. If the memory block passes the erase verify 309, the erase operation is terminated 311.

If the memory block fails the erase verify 309, all of the word lines of the memory block are biased at ground potential. An erase pulse at the initial well voltage (e.g., +15V) is then applied to the well 313. This essentially performs a "normal" erase operation on the selected memory block. Another erase verify operation is then performed 315. If this erase verify passes, the erase operation is terminated 311.

If the erase verify fails, the edge row word lines are counter-biased again and erase well bias is incremented 317 by a step voltage. In one embodiment, this step voltage is substantially equal to the counter-bias potential used on the edge word lines (e.g., +1V). After the erase well bias has been incremented, an erase pulse at this voltage is applied to the memory well.

If an erase verification passes 309, the erase operation is terminated 311. If the erase verification fails, another "normal" erase step is performed at the incremented erase well voltage with the word lines for all edge and core rows (i.e., non-edge word lines) at ground potential. This is repeated, as shown in FIG. 3, until the memory block verifies as being erased or an erase error condition is flagged (i.e., block does not erase).

In one embodiment, the erase method of FIG. 3 is performed on a NAND MLC non-volatile memory device in which the edge rows store SLC data while the remaining core rows (i.e., non-edge) store MLC data. The overall size of the memory block can be kept the same by adding a new physical row as shown in FIG. 4.

Figure 4:
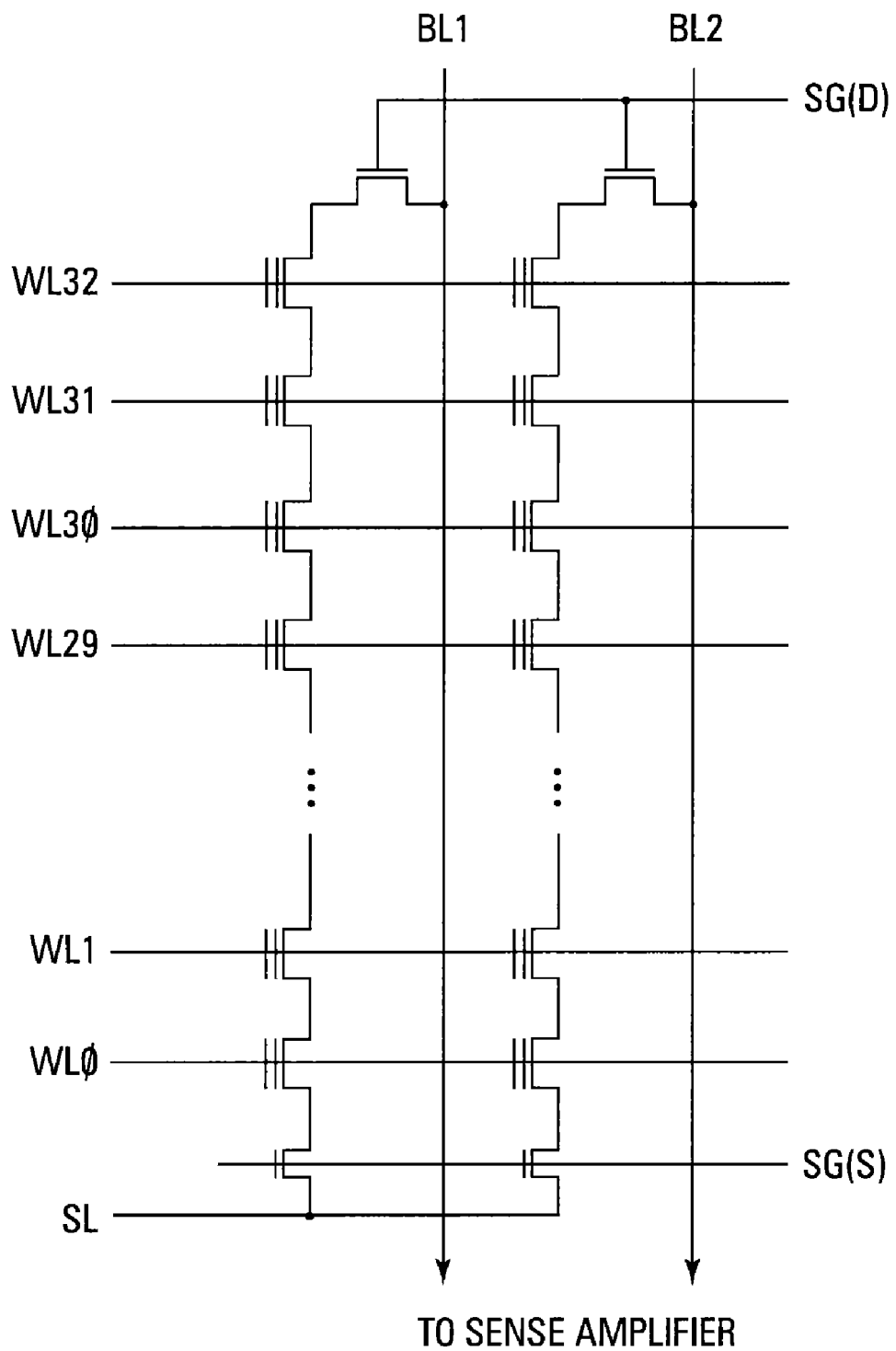
FIG. 4 shows an alternate embodiment of a NAND series memory string incorporating an extra row of memory cells.

FIG. 4 illustrates an alternate embodiment of two NAND series strings of memory cells that incorporate an additional row of memory cells. This embodiment normally would have 32 rows of memory cells. The embodiment of FIG. 4 adds a thirty-third row. Alternate embodiments can start with 64 or more rows and add another row onto that quantity.

Since the cells on edge rows program only to a lower threshold to store one bit (i.e., 2 logic states), these cells should degrade less through cycling and, thus, require smaller erase voltages after cycling. This should induce lower stress on edge rows during an erase operation using the method of FIG. 3 so that rows 0 and 31 should experience less erase degradation.

In another embodiment, the edge-row cells can be intentionally allowed to erase to a shallower (less negative) threshold than the core-row cells. For this, erase verify is performed with a more positive voltage on the edge-row word lines than the voltage on all core-row word lines. This voltage difference between edge-rows and core-rows can be in the same direction, value range and/or equal with the counter-bias voltage applied in the erase pulse $V_{counter-bias}$. In this embodiment, the word line voltage for edge rows in selected read and selected program verify operations would also be increased by the same amount (about equal with $V_{counter-bias}$) compared with the word line voltage in selected read and program verify for core rows. If this causes a reduction of $V_t$ space available for storage of logic states, the memory can be devised to store fewer logic states in the edge-row cells than in the core-row cells. Core-row word lines are held at ground potential during both erase pulse and verify pulses.

Such a positive offset voltage for the edge rows in erase verify, selected read and program verify operations is convenient in the implementation with two logic states only on edge rows. In this case, for the cells on edge rows the $V_t$ space available for each state is larger in the positive $V_t$ range. Thus the boundary between states represented by selected read and program verify voltages may have room to be moved to a more positive voltage.

Figure 5:
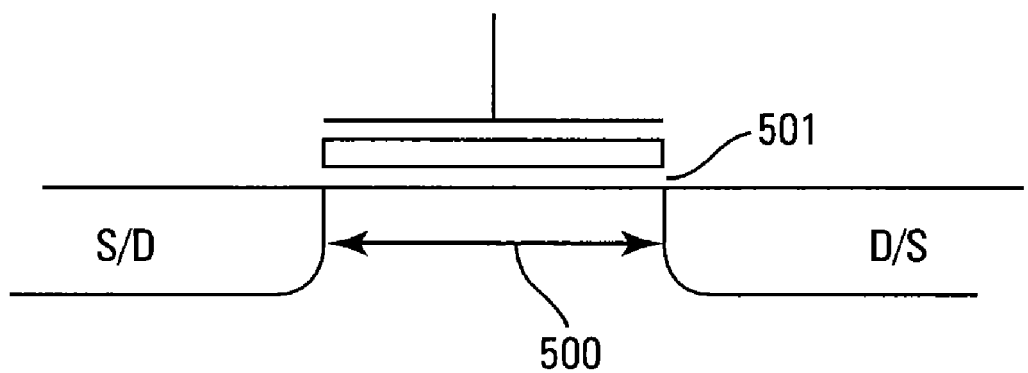
FIG. 5 shows a cross sectional view of one embodiment of a floating gate memory cell having dimensions that are adjusted in accordance with the method for erasing of FIG. 3.

In another embodiment, the effectiveness of the erase method of FIG. 3 could be increased if the memory cells of edge rows 0 and 31 were designed to be easier to erase than the cells on the core rows of the memory block. FIG. 5 illustrates a cross sectional view of a semiconductor, floating gate memory cell. If the gate stack was made wider 500 and/or the tunnel oxide 501 was formed thinner for the edge rows of the memory block than for the core rows, the effectiveness of the method of FIG. 3 might be increased.

Figure 6:
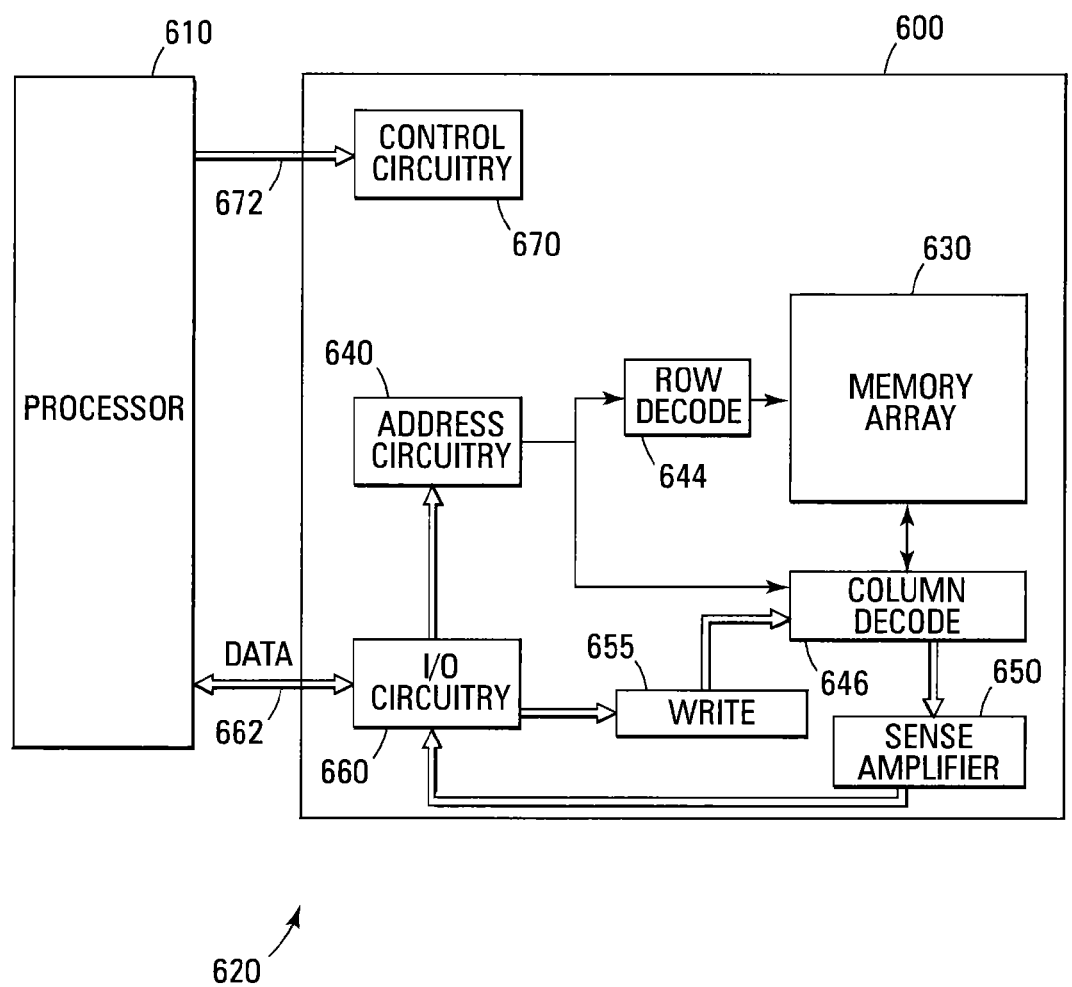
FIG. 6 shows a block diagram of one embodiment of a memory system that can incorporate the method for erasing a selected block of memory cells.

FIG. 6 illustrates a functional block diagram of a memory device 600 that uses the erase method of FIG. 3. The memory device 600 is coupled to a controller 610. The controller 610 may be a microprocessor or some other type of controlling circuitry. The memory device 600 and the controller 610 form part of a memory system 620. The memory device 600 has been simplified to focus on features of the memory that are helpful in understanding the present invention. The memory and controller can be discrete devices, separate integrated circuits, a controller with an embedded memory device, or a common integrated circuit.

The memory device includes an array of memory cells 630 that, in one embodiment, are non-volatile memory cells such as flash memory cells. The memory array 630 is arranged in banks of rows and columns. The control gates of each row of memory cells are coupled to word lines while the drain and source connections of the memory cells are coupled to bit lines. As is well known in the art, the connection of the cells to the bit lines depends on whether the array is a NAND architecture, a NOR architecture, an AND architecture, or some other array architecture.

An address buffer circuit 640 is provided to latch address signals provided over I/O connections 662 through the I/O circuitry 660. Address signals are received and decoded by row decoders 644 and column decoders 646 to access the memory array 630. It will be appreciated by those skilled in the art that, with the benefit of the present description, the number of address input connections and row/column decoders depends on the density and architecture of the memory array 630. That is, the number of addresses increases with both increased memory cell counts and increased bank and block counts.

The memory integrated circuit 600 reads data in the memory array 630 by sensing voltage or current changes in the memory array columns using sense/buffer circuitry 650. The sense/buffer circuitry, in one embodiment, is coupled to read and latch a row of data from the memory array 630. Data input and output buffer circuitry 660 is included for bi-directional data communication over the I/O connections 662 with the processor 610. Write circuitry 655 is provided to write data to the memory array.

Control circuitry 670 decodes signals provided on control connections 672 from the processor 610. These signals are used to control the operations on the memory array 630, including data read, data write, and erase operations. The control circuitry 670 may be a state machine, a sequencer, or some other type of controller. The control circuitry 670 of the present invention, in one embodiment, is responsible for executing the embodiments of the erase method.

The flash memory device illustrated in FIG. 6 has been simplified to facilitate a basic understanding of the features of the memory and is for purposes of illustration only. A more detailed understanding of internal circuitry and functions of flash memories are known to those skilled in the art. Other embodiments may include the flash memory cell of the present invention in other types of electronic systems.

CONCLUSION

In summary, the above-described embodiments provide reduced erase degradation of memory cells on the edge of selected memory blocks being erased. By performing an intermediate erase step of erasing with a counter-bias of edge cells prior to performing a normal erase operation, the erase degradation of the edge cells can be reduced.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for erasing a memory device, the method comprising:
    applying a positive voltage to control gates of a plurality of particular rows of memory cells of a selected block of memory cells, wherein the positive voltage is greater than a ground potential and the plurality of particular rows of memory cells are edge rows of the selected block of memory cells;
    applying the ground potential to control gates of all remaining rows of memory cells of the selected block of memory cells; and
    applying an erase voltage to the selected block of memory cells.

2. The method of claim 1 wherein the selected block of memory cells is formed in a semiconductor well and the erase voltage is applied to the semiconductor well.

3. The method of claim 1 wherein the positive voltage is in a range of 0.2V to 2V.

4. The method of claim 1 wherein the erase voltage is a positive voltage pulse.

5. The method of claim 1 and further including determining if threshold voltages of the selected block of memory cells are at a negative voltage after applying the erase voltage.

6. The method of claim 5 wherein determining if the threshold voltages of the selected block of memory cells are at a negative voltage comprises:
    applying an erase verify voltage to control gates of the memory cells of the selected block;
    detecting a rate of voltage decay on bit lines coupled to the memory cells; and
    determining the threshold voltages of the selected block of memory cells in response to the rate of voltage decay.

7. A method for erasing a memory device, the method comprising:
    performing an intermediate erase operation that comprises applying an erase voltage to a selected memory block while applying a voltage that is greater than 0V to control gates of only edge rows of memory cells of the selected memory block; and applying 0V to control gates of all remaining rows of memory cells of the selected block of memory cells while applying the erase voltage.

8. The method of claim 7 wherein the voltage is also less than 2V.

9. The method of claim 7 and further comprising performing an erase verify operation after applying the erase voltage wherein the erase verify operation comprises applying a more positive voltage on control gates of edge row memory cells than a control gate voltage on all remaining memory cells of the selected memory block.

10. The method of claim 9 wherein a voltage difference between the more positive voltage and the control gate voltage on all remaining memory cells of the selected memory block is in a same direction, value range, and/or equal to the voltage that is greater than 0V.

11. The method of claim 7 and further comprising performing a program verify operation after a program operation wherein the edge rows of memory cells are biased with the voltage that is greater than 0V.

12. The method of claim 7 and further comprising performing a read operation wherein the edge rows of memory cells are biased with the voltage that is greater than 0V.

13. The method of claim 11 wherein the edge rows of memory cells are configured to store fewer logic states than in core rows of memory cells if the voltage that is greater than 0V causes a reduction in threshold voltage space available for the logic states.

14. A memory device comprising:
a memory array comprising a plurality of memory cells; and
memory control circuitry coupled to the memory array and configured to control operation of the memory device, the memory control circuitry further configured to erase a selected memory block by initiating an intermediate erase operation prior to a normal erase operation wherein the intermediate erase operation applies a first erase voltage to a semiconductor well comprising a selected memory block while only control gates of edge rows of memory cells of the selected memory block are biased at a voltage that is greater than 0V and wherein the control circuitry is further configured to initiate the normal erase operation when an erase verify operation determines that the selected memory block has not been erased.

15. The memory device of claim 14 wherein the memory control circuitry is further configured to allow the edge rows of memory cells to erase to a less negative threshold voltage than core-row memory cells.

16. The memory device of claim 15 wherein the memory control circuitry is configured to perform the erase verify operation with a more positive voltage on the edge row memory cells than the core row memory cells.

17. The memory device of claim 14 wherein the selected memory block comprises NAND multiple level cell memory cells.

18. The memory device of claim 14 wherein the selected memory block comprises an odd number of rows of memory cells.

19. The memory device of claim 14 wherein the edge rows of memory cells are configured to be programmed with fewer logical states than core row memory cells.

* * * * *